(12) United States Patent
Yamaguchi et al.

(10) Patent No.: US 10,755,971 B2
(45) Date of Patent: Aug. 25, 2020

(54) METHOD OF MANUFACTURING SEMICONDUCTOR DEVICE

(71) Applicant: TOKYO ELECTRON LIMITED, Tokyo (JP)

(72) Inventors: Tatsuya Yamaguchi, Yamanashi (JP); Reiji Niino, Yamanashi (JP); Hiroyuki Hashimoto, Yamanashi (JP); Syuji Nozawa, Yamanashi (JP); Makoto Fujikawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/563,007

(22) Filed: Sep. 6, 2019

(65) Prior Publication Data

US 2019/0393083 A1  Dec. 26, 2019

Related U.S. Application Data

(63) Continuation of application No. 15/936,805, filed on Mar. 27, 2018, now Pat. No. 10,446,438.

(30) Foreign Application Priority Data

Mar. 30, 2017  (JP) .................................. 2017-068759

(51) Int. Cl.
*H01L 21/768* (2006.01)
*H01L 21/76* (2006.01)
(Continued)

(52) U.S. Cl.
CPC .. *H01L 21/76826* (2013.01); *H01L 21/02118* (2013.01); *H01L 21/02282* (2013.01);
(Continued)

(58) Field of Classification Search
CPC ......... H01L 21/76826; H01L 21/76877; H01L 21/76807; H01L 21/6715; H01L 21/67017;
(Continued)

(56) References Cited

U.S. PATENT DOCUMENTS 9,414,445 B2  8/2016  Ahmad et al.
2003/0099844 A1*  5/2003  Hanahata ............. C09D 183/04
428/447

(Continued)

OTHER PUBLICATIONS

L. Zhang, et al. "Low damage integration of ultralow-k porous organosilicate glasses by Pore-Stuffing approach" PESM2014, Grenoble (France) 2014.

*Primary Examiner* — Marcos D. Pizarro
*Assistant Examiner* — Antonio B Crite
(74) *Attorney, Agent, or Firm* — Nath, Goldberg & Meyer; Jerald L. Meyer

(57) ABSTRACT

A method of manufacturing a semiconductor device by performing a process on a substrate includes: forming a protective layer made of a polymer having a urea bond by supplying a raw material for polymerization to a surface of a substrate on which a protected film to be protected is formed; forming a sealing film at a first temperature lower than a second temperature at which the polymer is depolymerized so cover a portion where the protective layer is exposed; subsequently, subjecting the substrate to a treatment at a third temperature equal to or higher than the second temperature at which the polymer as the protective layer is depolymerized; subsequently, performing a treatment which causes damage to the protected film when the protective layer is not present; and after the performing a treatment which causes damage to the protected film, depolymerizing the polymer by heating the substrate.

9 Claims, 25 Drawing Sheets

(51) Int. Cl.
*H01L 21/02* (2006.01)
*H01L 21/67* (2006.01)
*H01L 21/3105* (2006.01)
*H01L 21/3213* (2006.01)
*H01L 21/311* (2006.01)
*H01L 45/00* (2006.01)

(52) U.S. Cl.
CPC .... *H01L 21/3105* (2013.01); *H01L 21/31116* (2013.01); *H01L 21/31144* (2013.01); *H01L 21/32139* (2013.01); *H01L 21/67* (2013.01); *H01L 21/6715* (2013.01); *H01L 21/67017* (2013.01); *H01L 21/7681* (2013.01); *H01L 21/76811* (2013.01); *H01L 21/76828* (2013.01); *H01L 21/76834* (2013.01); *H01L 21/02126* (2013.01); *H01L 21/02164* (2013.01); *H01L 21/02203* (2013.01); *H01L 21/02271* (2013.01); *H01L 21/76846* (2013.01); *H01L 21/76877* (2013.01); *H01L 45/1675* (2013.01)

(58) Field of Classification Search
CPC ......... H01L 21/31144; H01L 21/02282; H01L 21/3105; H01L 21/02118; H01L 21/32139; H01L 21/67; H01L 21/31116
See application file for complete search history.

(56) References Cited

U.S. PATENT DOCUMENTS

| | | | |
|---|---|---|---|
| 2005/0277058 A1* | 12/2005 | Iwabuchi | G03F 7/091 430/272.1 |
| 2006/0069171 A1* | 3/2006 | Prokopowicz | C08J 9/26 521/61 |
| 2014/0187044 A1 | 7/2014 | Tsai | |
| 2017/0062374 A1* | 3/2017 | Chu | H01L 24/33 |

* cited by examiner

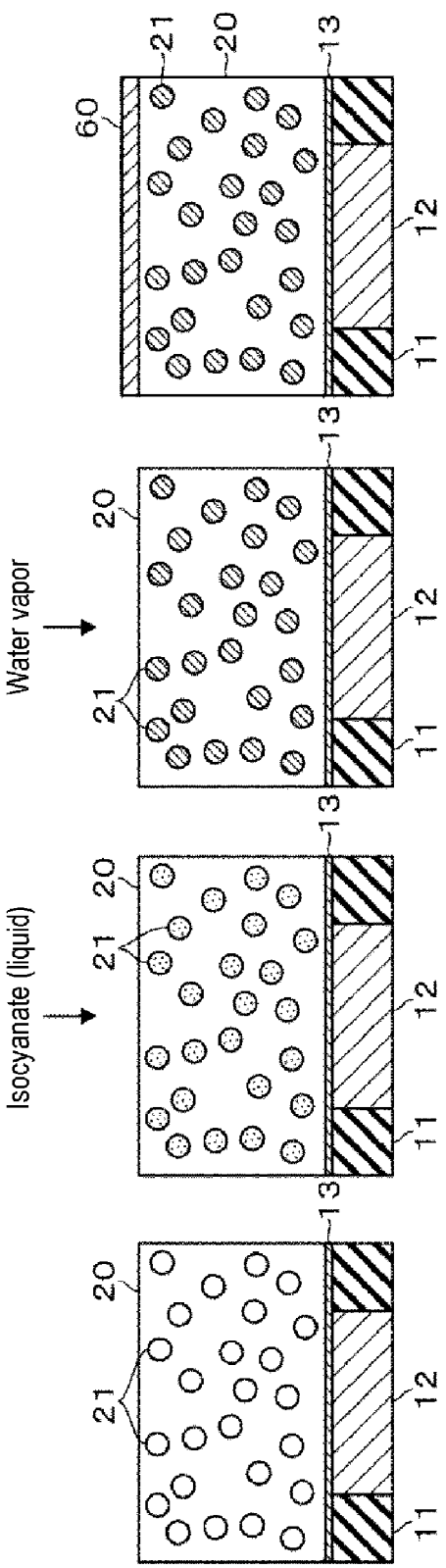

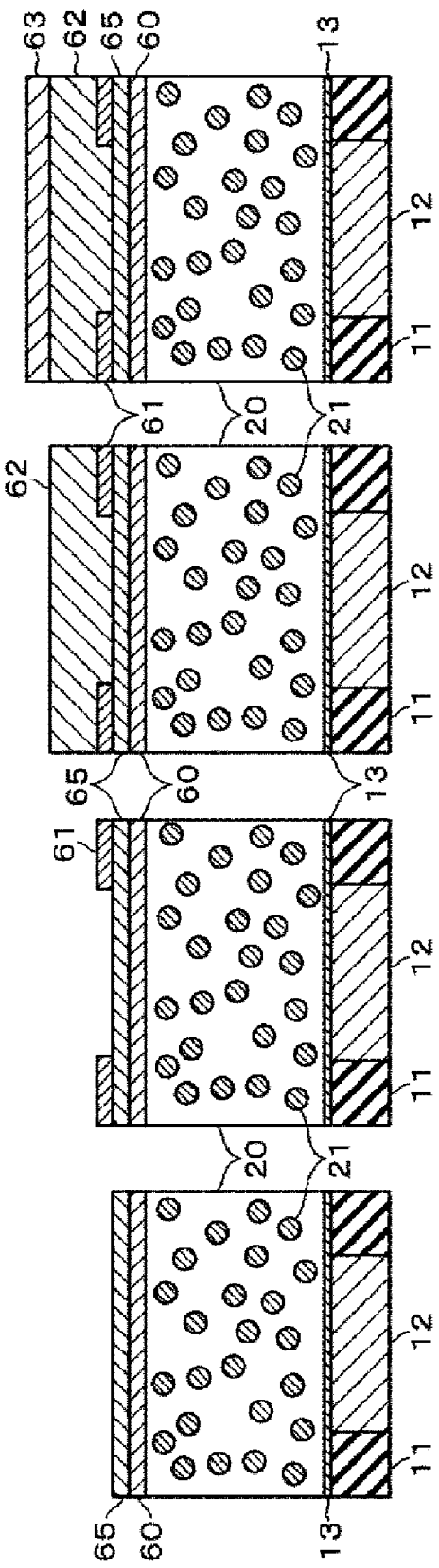

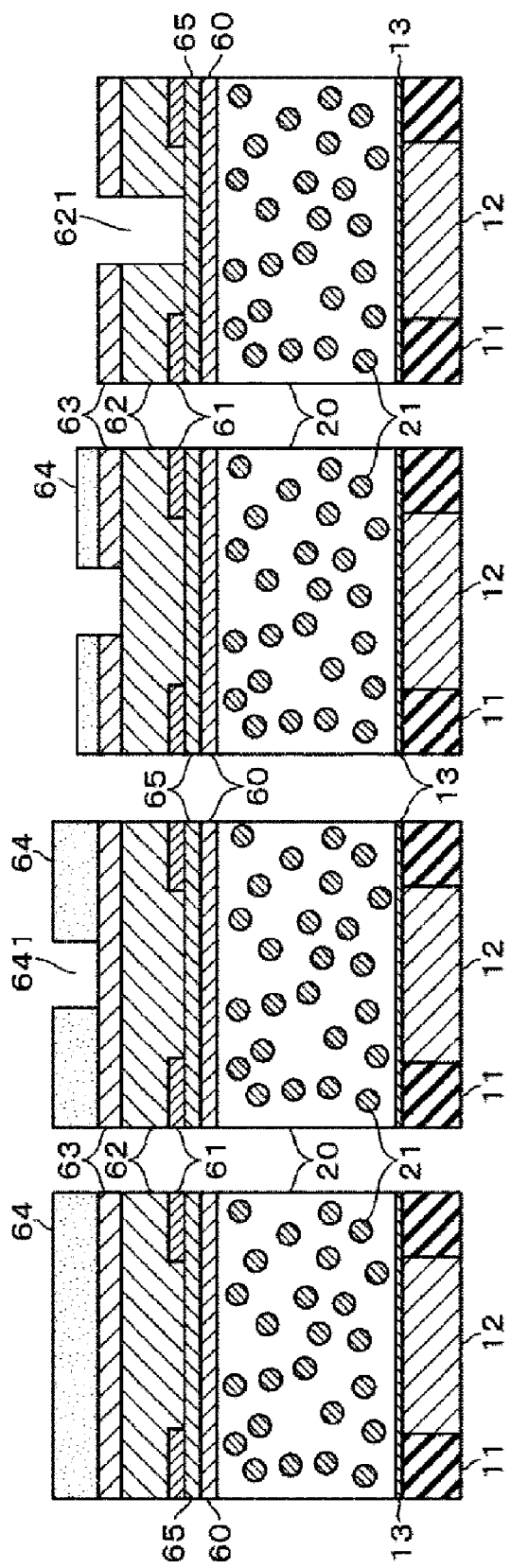

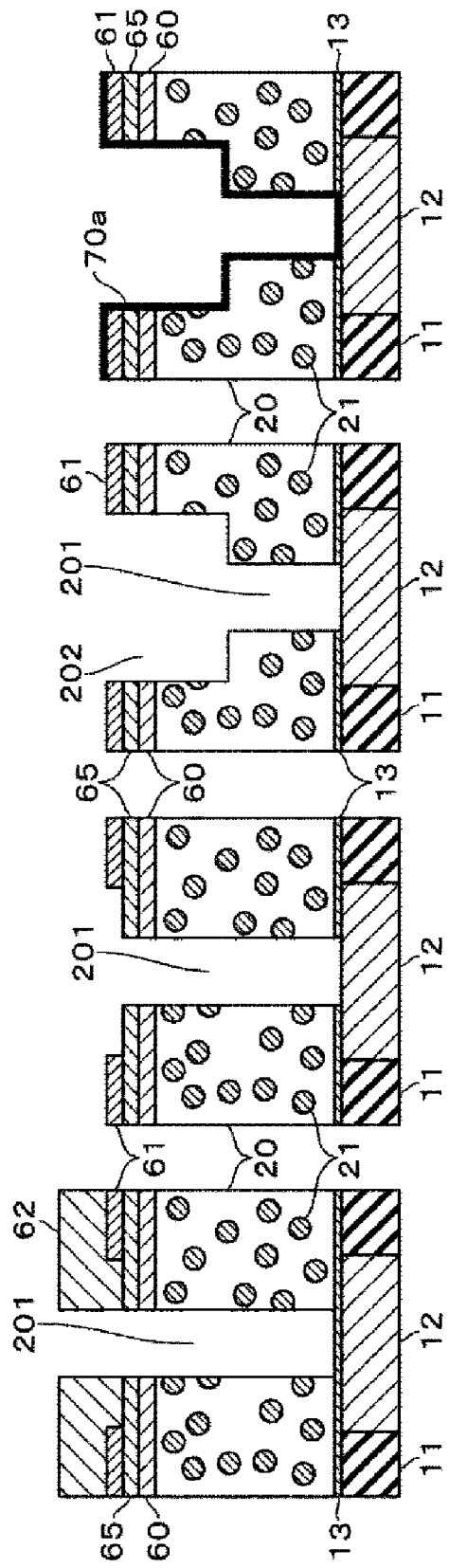

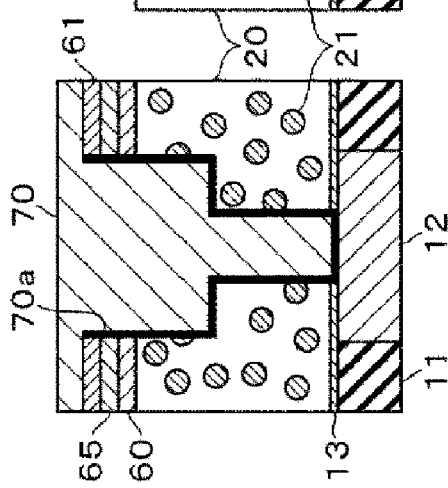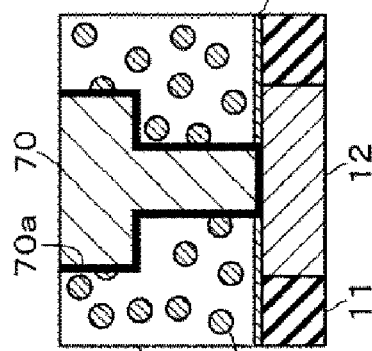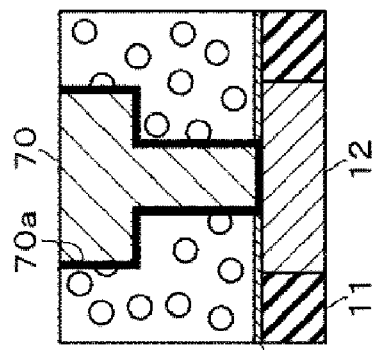

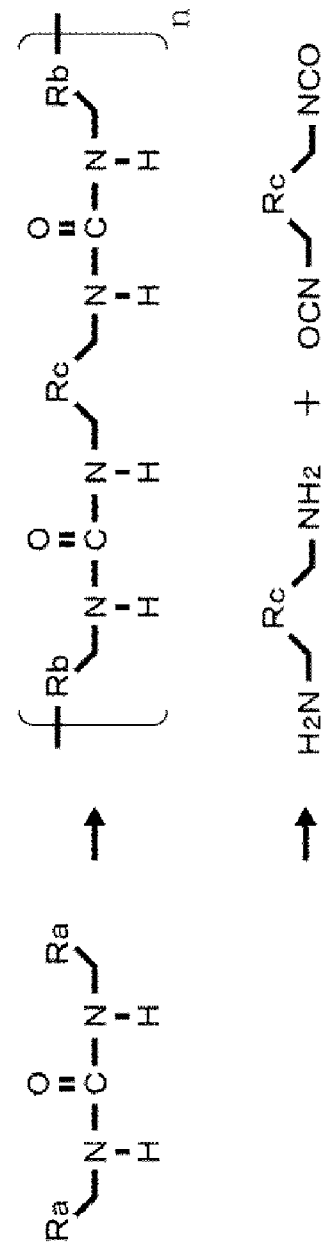

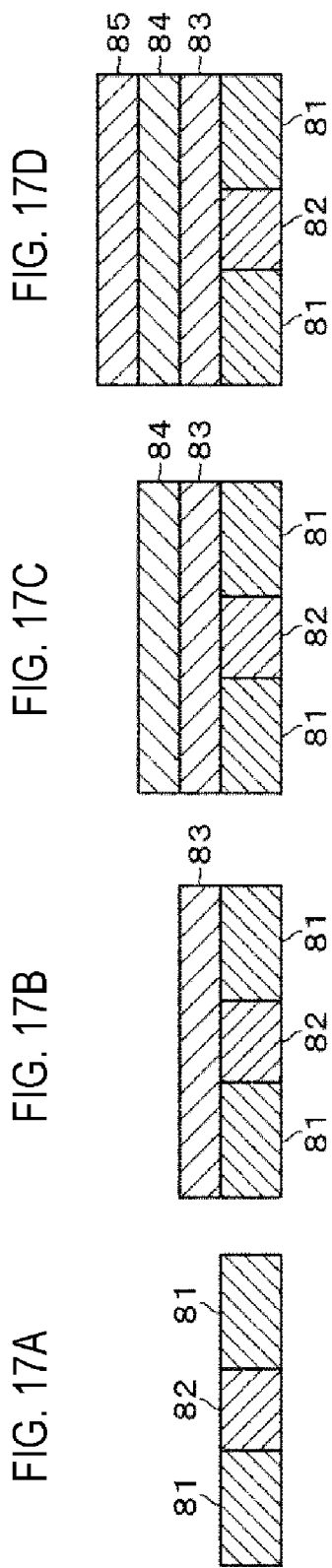

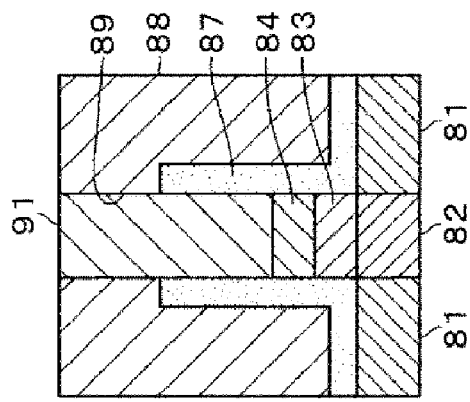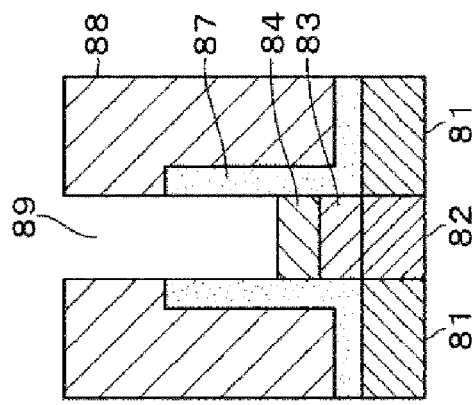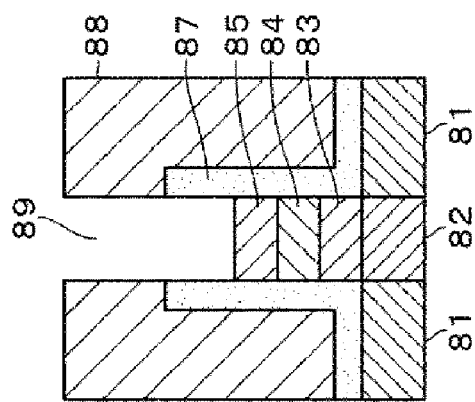

METHOD OF MANUFACTURING SEMICONDUCTOR DEVICE

CROSS-REFERENCE TO RELATED APPLICATION

This is a Continuation Application of U.S. patent application Ser. No. 15/936,805, filed Mar. 27, 2018, an application claiming benefit of priority from Japanese Patent Application No. 2017-068759, filed on Mar. 30, 2017, the entire contents of which are incorporated herein by reference.

TECHNICAL FIELD

The present disclosure relates to a technique of suppressing damage by forming a protective layer on a film formed on a substrate for manufacturing a semiconductor device.

BACKGROUND

In a process of manufacturing a semiconductor device, if the processing of a substrate is not carefully performed, the film previously formed on the substrate may be damaged. For example, when a plasma treatment such as etching or ashing is performed on a porous low dielectric constant film used as an interlayer insulating film in order to embed a wiring, the low dielectric constant film is damaged. Specifically, the porous low dielectric constant film is, for example, a SiOC film containing silicon, carbon, oxygen and hydrogen and having Si—C bonds. On an exposed surface of the SiOC film exposed to plasma, namely on a side wall and a bottom surface of a recess, for example, the Si—C bonds are broken by plasma and C is desorbed from the film. Si having unsaturated bonds generated due to desorption of C is unstable in that state. Thus, Si is bonded to, for example, moisture in the atmosphere, to become Si—OH constituting a damaged layer.

For example, a technique has been used in which a PMMA (acrylic resin) is embedded in advance in pores of a porous low dielectric constant film formed on a substrate, a process such as etching or the like is performed on the low dielectric constant film, the substrate is heated, a solvent is supplied, and a microwave is supplied to remove the PMMA. However, in order to remove the PMMA, it is necessary to spend a long period of time of about 20 minutes in a plasma treatment and to heat the substrate to a temperature of 400 degrees C. or higher. Therefore, there is a great concern that element portions already formed in the substrate may be adversely affected.

As another example, there is an example in which, in a process of manufacturing a memory element, a surface (interface) of an electrode film is oxidized to form a damaged layer as an oxide layer when a contact hole is formed by a plasma treatment. In this process, first, an electrode film and a mask (etching mask) film are laminated on a memory element film, for example, a metal oxide film, to form a laminate. Then, the laminate is etched. Subsequently, an insulating film is formed on the substrate. The laminate left by etching is buried in the insulating film. Then, the insulating film on the laminate is etched by the plasma treatment to form the contact hole.

In the plasma treatment, the mask film is over-etched, and a damaged layer (oxide layer) is formed at the interface of the electrode film. Thus, for example, a reduction treatment is performed by hydrogen annealing or the like. However, there is a possibility that the removal of the damaged layer becomes insufficient even if the reduction treatment is performed.

Furthermore, in the concept of thermal decomposition of a resin, it is known that as the resin removal temperature decreases, a heat resistant temperature of the resin also decreases. It is also known that only a PMMA can be thermally unstuffed at 400 degrees C., which is an allowable temperature in a wiring process. However, the thermal stability of the PMMA drops to 250 degrees C. This means that if a temperature of 250 degrees C. or higher is applied to the PMMA during a protection process using the PMMA, a PMMA film deteriorates so that it cannot be used as a protective film.

Therefore, the technique described above is not a technique in which a protective film functions as a protective film even when a thermal process is performed at a temperature exceeding a protective film removal temperature as in the present disclosure.

SUMMARY

Some embodiments of the present disclosure provide a technique capable of suppressing damage on a film which is formed on a substrate in order to manufacture a semiconductor device.

According to one embodiment of the present disclosure, there is provided a method of manufacturing a semiconductor device by performing a process on a substrate, including: forming a protective layer made of a polymer having a urea bond by supplying a raw material for polymerization to a surface of a substrate on which a protected film to be protected is formed; forming a sealing film at a first temperature lower than a second temperature at which the polymer is depolymerized, so as to cover a portion where the protective layer is exposed; after the forming a sealing film, subjecting the substrate to a treatment at a third temperature equal to or higher than the second temperature at which the polymer as the protective layer is depolymerized; after the subjecting the substrate to a treatment at a third temperature, performing a treatment which causes damage to the protected film when the protective layer is not present; and after the performing a treatment which causes damage to the protected film, depolymerizing the polymer by heating the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 1A to 1D are explanatory views showing some steps of a semiconductor device manufacturing method according to a first embodiment of the present disclosure.

FIGS. 2E to 2H are explanatory views showing some steps of the semiconductor device manufacturing method according to the first embodiment of the present disclosure.

FIGS. 3I to 3L are explanatory views showing some steps of the semiconductor device manufacturing method according to the first embodiment of the present disclosure.

FIGS. 4M to 4P are explanatory views showing some steps of the semiconductor device manufacturing method according to the first embodiment of the present disclosure.

FIGS. 5Q to 5S are explanatory views showing some steps of the semiconductor device manufacturing method according to the first embodiment of the present disclosure.

FIG. 15 is an explanatory view showing how a polymer having a urea bond is produced by cross-linking monomers having a urea bond.

FIGS. 17A to 17D are explanatory views showing some steps of a semiconductor device manufacturing method according to a second embodiment of the present disclosure.

FIGS. 19I to 19K are explanatory views showing some steps of the semiconductor device manufacturing method according to the second embodiment of the present disclosure.

DETAILED DESCRIPTION

Figure 6:
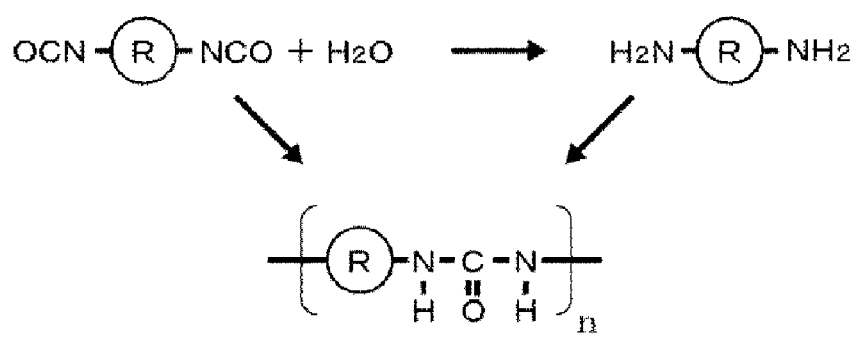
FIG. 6 is an explanatory view showing how a polymer having a urea bond is produced by self-polymerization using isocyanate and water.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment in which a semiconductor device manufacturing method according to the present disclosure is applied to a process of forming a wiring of a semiconductor device by dual damascene will be described. FIGS. 1A to 3L are explanatory views showing stepwise how to form an upper-layer-side circuit portion on a lower-layer-side circuit portion. Reference numeral 11 denotes, for example, an interlayer insulating film formed at the lower layer side, reference numeral 12 denotes a copper wiring which is a wiring material embedded in the interlayer insulating film 11, and reference numeral 13 denotes an etching stopper film having a function of a stopper at the time of etching. The etching stopper film 13 is formed of, for example, SiC (silicon carbide), SiCN (silicon carbide nitride), or the like.

A low dielectric constant film 20 as an interlayer insulating film is formed on the etching stopper film 13. In this example, a SiOC film is used for the low dielectric constant film 20. The SiOC film is formed by a CVD method, for example, by converting DEMS (diethoxymethylsilane) into plasma. The low dielectric constant film 20 is porous. In FIGS. 1A to 3L, pores 21 in the low dielectric constant film 20 are shown schematically with emphasis. A SiOC film is also used for the interlayer insulating film 11 formed at the lower layer side.

In the method of the present embodiment, as shown in FIG. 1A, the lower-layer-side circuit portion is formed on the surface of a semiconductor wafer (hereinafter referred to as wafer), which is a substrate. The porous low dielectric constant film 20 is formed on the lower-layer-side circuit portion. Processing is started in this state. In this example, the low dielectric constant film 20 corresponds to a protected film.

In the present embodiment, the pores 21 in the low dielectric constant film 20 are filled with a polymer (polyurea) having urea bonds, which is a filling material, as described below. The polyurea embedded in the pores 21 in the low dielectric constant film 20 corresponds to a protective layer for protecting the low dielectric constant film 20 as a protected film from the plasma in a plasma treatment described later. As a method for producing the polyurea, there is available a technique such as copolymerization or the like as described later. In this example, a technique of producing the polymer by self-polymerization will be described.

First, isocyanate (liquid), which is a raw material of self-polymerization, is impregnated into the low dielectric constant film 20 (FIG. 1B), and then the low dielectric constant film 20 is impregnated with moisture, for example, water vapor (FIG. 1C). When isocyanate is reacted with moisture, the isocyanate is hydrolyzed to immediately produce polyurea, and the pores 21 of the low dielectric constant film 20 are filled with the polyurea. FIG. 6 shows such a reaction. A portion of the isocyanate becomes amine which is an unstable intermediate product. The intermediate product and the non-hydrolyzed isocyanate are reacted with each other to produce polyurea. In FIG. 6, R is, for example, an alkyl group (linear alkyl group or cyclic alkyl group) or an aryl group, and n is an integer of two or more.

Figure 7:
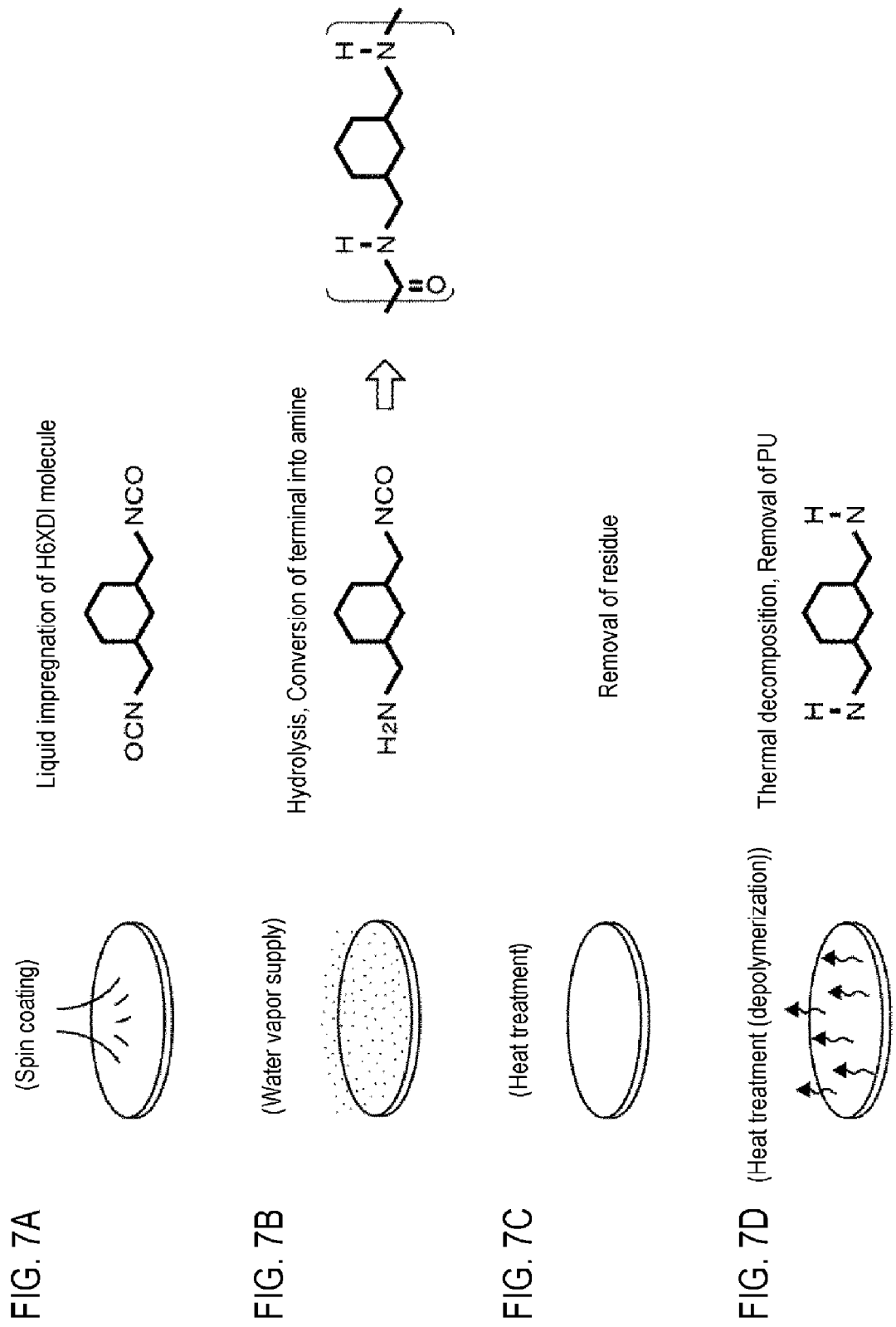
FIGS. 7A to 7D are explanatory views showing stepwise a process of producing a polymer having a urea bond by self-polymerization using isocyanate and water.
Figure 8:
FIG. 8 is a molecular structure diagram showing a molecular structure of an example of isocyanate.

As the isocyanate, for example, an alicyclic compound, an aliphatic compound, an aromatic compound or the like may be used. As the alicyclic compound, for example, 1,3-bis (isocyanatomethyl) cyclohexane (H6XDI) may be used as shown in FIG. 7A described later. As the aliphatic compound, for example, hexamethylene diisocyanate may be used as shown in FIG. 8. The isocyanate may have a melting point of 100 degrees C. or less and may be liquid at room temperature.

FIGS. 7A to 7D are explanatory views schematically showing the state of a process using H6XDI as a raw material monomer, in which treatments performed on a wafer W and chemical formulae are associated with one another. FIG. 7A corresponds to a process of supplying isocyanate to the wafer W, which is shown in FIG. 1B. First, by spin-coating the liquid of H6XDI on the wafer W, the liquid is impregnated into the low dielectric constant film 20.

Figure 9:
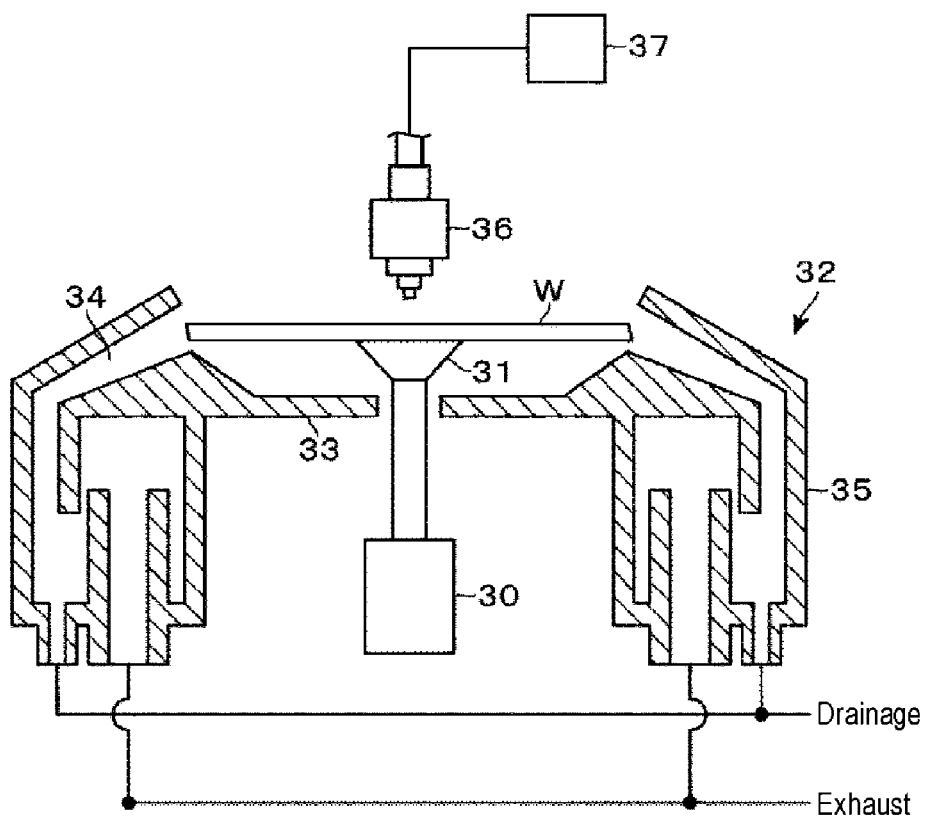
FIG. 9 is a sectional view showing an apparatus for supplying isocyanate liquid to a substrate.

As a spin coating apparatus for performing the spin coating, for example, an apparatus shown in FIG. 9 may be used. In FIG. 9, reference numeral 31 denotes a vacuum chuck which is rotated by a rotation mechanism 30 while adsorptively holding the wafer W, reference numeral 32 denotes a cup module, and reference numeral 33 denotes a guide member having a cylindrical outer peripheral wall and a cylindrical inner peripheral wall which extend downward. Reference numeral 34 denotes a discharge space formed between an outer cup 35 and the outer peripheral wall so that exhaust and drainage can be performed over the entire circumference. The lower side of the discharge space 33 has a structure capable of gas-liquid separation. The liquid is supplied from a liquid supply source 37 to the central portion of the wafer W via a nozzle 36. The wafer W is rotated at a rotation speed of, for example, 1,500 rpm, to spread the liquid on the surface of the wafer W, thereby forming a coating film.

Subsequently, placing the wafer W in a heated atmosphere of 80 degrees C. and in a water vapor atmosphere (relative humidity 100%), water vapor permeates into the low dielectric constant film 20. FIG. 7B corresponds to a process of supplying water vapor as moisture to the wafer W, as shown in FIG. 1C.

Figure 10:
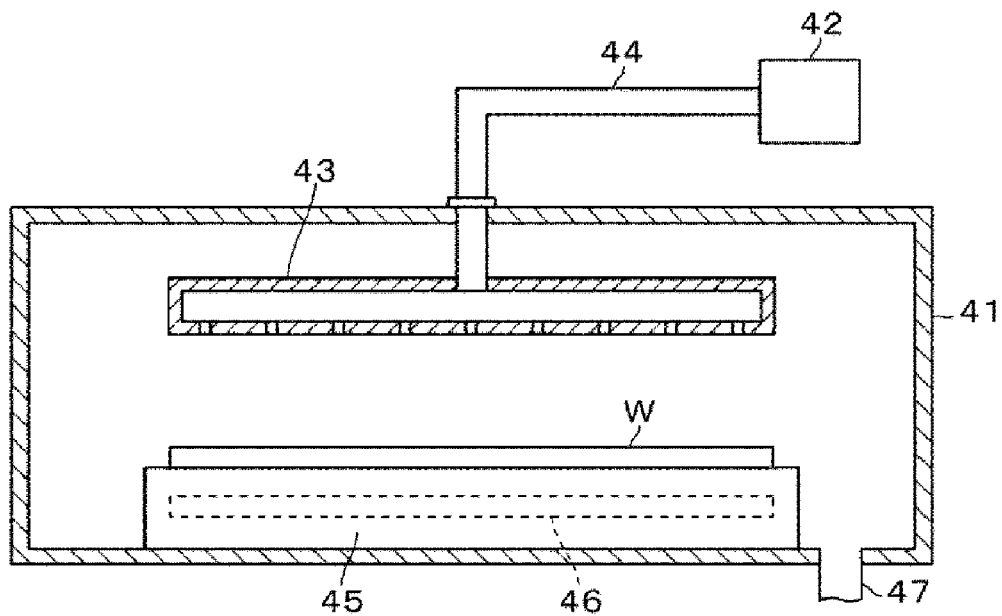
FIG. 10 is a sectional view showing an apparatus for supplying water vapor to a substrate to which isocyanate liquid has been supplied.

For example, the apparatus shown in FIG. 10 may be used as an apparatus for performing the water vapor treatment. In FIG. 10, reference numeral 41 denotes a processing container in which a water vapor atmosphere is established, reference numeral 42 denotes a water vapor generation part, reference numeral 43 denotes a water vapor discharging part having a large number of holes formed in the lower surface thereof, reference numeral 44 denotes a conduit for guiding water vapor to a diffusion space defined inside the water vapor discharge part 43, reference numeral 45 denotes a mounting table incorporating a heater 46, and reference numeral 47 denotes an exhaust pipe from which a gas is exhausted by a suction mechanism. An inner wall of the processing container 41 is heated to, for example, 80 degrees C. by a heating mechanism (not shown). The wafer W is mounted on the mounting table 45 and is exposed to an atmosphere of the water vapor discharged from the water vapor discharge part 43.

As the apparatus for performing the water vapor treatment, it may be possible to adopt a configuration in which, instead of providing the water vapor generation part 42 and the water vapor discharge part 43, a flat container with a lid is provided above the mounting table 45, and the flat container is heated with water accommodated therein so that the interior of the processing container is kept in the water vapor atmosphere. In this case, when loading and unloading the wafer W, the flat container is opened and closed by the lid.

Since H6XDI is already impregnated into the low dielectric constant film 20, when the water vapor permeates into the low dielectric constant film 20, hydrolysis occurs as described above. Thus, a polymerization reaction occurs immediately to produce polyurea. Therefore, the pores 21 in the low dielectric constant film 20 are filled with the polyurea. In FIGS. 1A to 1D, for the sake of convenience in illustration, the state in which the pores 21 are filled with a raw material monomer (liquid of H6XDI in this example) is indicated by "dots" and the state in which the pores 21 are filled with polyurea is indicated by "oblique lines."

Figure 11:
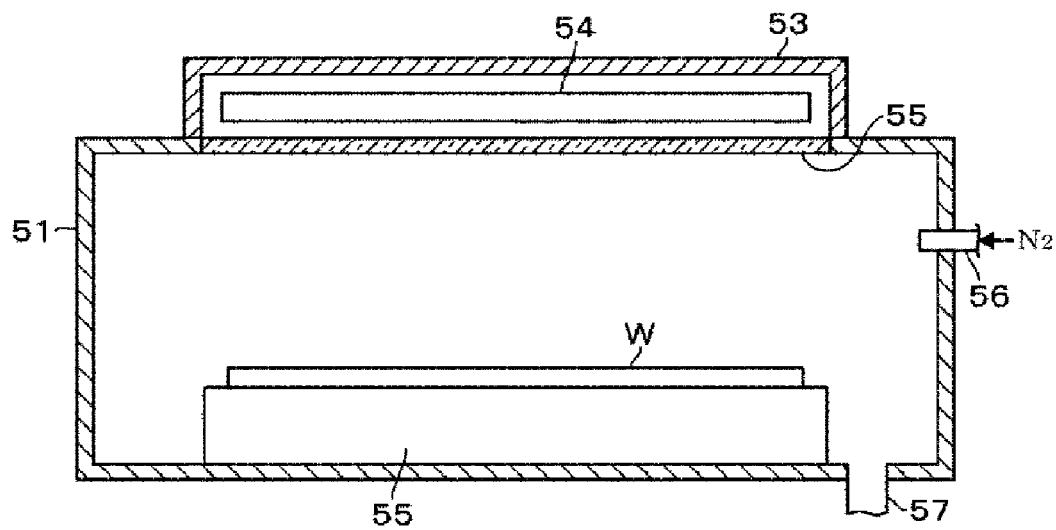
FIG. 11 is a sectional view showing a heating apparatus for heating a substrate to which isocyanate and water vapor have been supplied.

Subsequently, the wafer W is heated to remove residue existing in the low dielectric constant film 20 (FIG. 7C). The heating temperature is set to 200 degrees C. or higher, for example, 250 degrees C. The wafer is heated in an inert gas atmosphere, for example, a nitrogen gas atmosphere. For example, as shown in FIG. 11, this process may be carried out by mounting the wafer W on the mounting table 52 inside the processing container 51 and heating the wafer W with an infrared lamp 54 provided inside a lamp house 53. In FIG. 11, reference numeral 55 denotes a transmission window, reference numeral 56 denotes a supply pipe for supplying a nitrogen gas, and reference numeral 57 denotes an exhaust pipe. A processing atmosphere at that time is, for example, an atmospheric pressure atmosphere, but may be a vacuum atmosphere.

After the pores 21 of the low dielectric constant film 20 are filled with the polyurea, a step of forming a via-hole and a trench (groove for burying a wiring) is performed on the low dielectric constant film 20. Prior to this step, a sealing film 60 is formed on the low dielectric constant film 20 (FIG. 1D). The sealing film 60 is formed to enhance the heat resistance of the polyurea (hatched portion) inside the pores 21 which is a protective layer. Accordingly, the sealing film 60 is formed at a temperature lower than a temperature at which the polyurea (polymer) is depolymerized, for example, at 250 degrees C. or lower.

In this example, the sealing film 60 is a polyimide film. For example, the sealing film 60 is formed at a temperature of 150 to 200 degrees C. in a vacuum atmosphere by vapor deposition using a mixed gas of pyromellitic anhydride (PMDA) and 4,4'-oxydianiline (ODA). A film thickness of the sealing film 60 is, for example, 100 nm. The polyimide film may be formed by coating a chemical solution, instead of the vapor deposition method. Since the polyurea in the pores 21 is exposed on the surface of the low dielectric constant film 20, it can be said that the sealing film 60 is formed so as to cover a portion where the protective layer (polyurea) is exposed.

After forming the sealing film 60, as shown in FIG. 2E, a silicon oxide film 65 is formed on the surface of the sealing film 60 by CVD (Chemical Vapor Deposition), for example, in a vacuum atmosphere and at a process temperature of 300 degrees C. The silicon oxide film 65 is formed, for example, by allowing vapor of an organic silicon raw material to react with an oxidizing gas such as oxygen or ozone. The silicon oxide film 65 plays a role of a pattern mask (hard mask) during the etching to be described later. The film formation process of the silicon oxide film 65 corresponds to a process performed on the wafer W at a temperature higher than the temperature at which the protective layer is depolymerized.

Subsequently, a hard mask 61, which is a pattern mask for etching made of, for example, a TiN (titanium nitride) film which has an opened portion corresponding to the trench, is formed by a well-known method (FIG. 2F).

Subsequently, a masking film 62 serving as a mask when etching the via-hole is formed on the hard mask 61 (FIG. 2G). Further, an antireflection film 63 and a resist film 64 are laminated on the masking film 62 in the named order (FIGS. 2H and 3I). For example, an organic film containing carbon as a main component is used as the masking film 62. This organic film is obtained by spin-coating a chemical solution on the wafer W inside an apparatus for forming the antireflection film 63 and the resist film 64 to form a resist pattern.

Thereafter, a resist pattern is formed by exposing and developing the resist film 64 so as to form an opening 641 in a portion corresponding to the via-hole (FIG. 3J). Using this resist pattern, the antireflection film 63 is etched by, for example, a CF-based gas (FIG. 3K). Subsequently, using the antireflection film 63 as a mask, the masking film 62 is etched by, for example, the plasma obtained by converting an oxygen gas into plasma. At this time, the resist film 64 is also etched and removed (FIG. 3L). In this manner, an opening 621 is formed at a position corresponding to the via-hole in the masking film 62.

Subsequently, using the masking film 62 as an etching mask, the low dielectric constant film 20 is etched to form a via-hole 201 (FIG. 4M). As a technique of etching the low dielectric constant film 20, namely the SiOC film in this example, the etching may be performed by plasma obtained by converting a $C_6F_6$ gas into plasma. In this case, a small amount of oxygen gas may be added.

Thereafter, the etching stopper film 13 at the bottom of the via-hole 201 is removed by etching. In the case where the etching stopper film 13 is, for example, an SiC film, this etching may be performed by, for example, plasma obtained by converting a $CF_4$ gas into plasma. Subsequently, the masking film 62 is removed by ashing with plasma obtained by converting an oxygen gas into plasma (FIG. 4N).

Subsequently, similar to the process of forming the via-hole 201, the low dielectric constant film 20 is etched using the hard mask 61 to form a trench 202 in a region surrounding the via-hole 201 (FIG. 4O). Thereafter, a barrier layer, for example, a barrier layer 70a composed of a laminated film of Ti and TiON and configured to prevent copper as a conductive path described below from diffusing into the low dielectric constant film 20 as an interlayer insulating film, is formed on inner surfaces of the via-hole 201 and the trench 202 (FIG. 4P). Thereafter, the via-hole 201 and the trench 202 are filled with copper (FIG. 5Q). The excess copper, the barrier layer 70a, the sealing film 60, the silicon oxide film 65 and the hard mask 61 are removed by CMP (Chemical Mechanical Polishing) to form a copper wiring 70, whereby the upper-layer-side circuit portion is formed (FIG. 5R).

In the above, it is necessary that each process performed thus far is carried out at a temperature lower than the temperature at which the polyurea is depolymerized. Then, the polyurea which is a filling material filling the pores 21 of the low dielectric constant film 20 is removed (FIG. 5S). When heated at 300 degrees C. or higher, for example, 350 degrees C., the polyurea is depolymerized to amine and is evaporated (FIG. 7D). In order not to adversely affect an element portion already formed on the wafer W, particularly a copper wiring, the polyurea may be heated at a temperature of less than 400 degrees C., for example 390 degrees C. or lower, for example 300 to 350 degrees C. A period of time during which the polyurea is depolymerized, for example, a period of time during which the polyurea is heated at a temperature of 300 to 400 degrees C., may be, for example, 5 minutes or less from the viewpoint of suppressing thermal damage to an element. As a heating method, an infrared lamp may be used as described above, or the wafer W may be heated by mounting the wafer W on the mounting table having a built-in heater. The heating atmosphere is, for example, an inert gas atmosphere such as a nitrogen gas atmosphere or the like.

In the above-described embodiment, isocyanate and moisture are sequentially supplied to the low dielectric constant film 20 to fill the pores 21 of the low dielectric constant film 20 with the polyurea which is a polymer having urea bonds, thereby forming a protective layer for protecting the low dielectric constant film 20. In this state, the low dielectric constant film 20 is etched to form the via-hole 201 and the trench 202, and the ashing of the etching mask is performed. Accordingly, in this example, the low dielectric constant film 20 is protected by the polyurea at the time of etching and ashing performed as plasma treatments. Thus, the occurrence of damage to the low dielectric constant film 20 is suppressed.

Furthermore, the film-forming temperature of the silicon oxide film 65 is, for example, 300 degrees C. which is higher than the depolymerization temperature of the polyurea. However, the sealing film 60 is formed on the low dielectric constant film 20 (the protective layer) filled with the polyurea. Therefore, the depolymerization of the polyurea is suppressed, and the function of the protective layer is not impaired. Since the polyurea is depolymerized at a temperature of about 300 degrees C., when the polyurea is removed from the low dielectric constant film 20, there is a risk of adversely affecting the element portion, particularly the copper wiring, already formed on the wafer W. In addition, since the removal of the polyurea can be performed only by the heat treatment, the method is simple.

The sealing film 60 is not limited to the polyimide film but may be a metal film or an insulating film as long as it can be formed at a temperature lower than the temperature at which the polyurea is generated. Examples of the metal film may include a TiN film, a TaN film and the like. The metal film may be formed by an electroless plating method or the like. Furthermore, examples of the insulating film may include a silicon oxide film formed by reacting an aminosilane-based gas and an oxidizing gas such as ozone or the like with each other in a vacuum atmosphere, and the like. In this case, the silicon oxide film may be formed at a low temperature of, for example, 250 degrees C. When the insulating film is used as the sealing film 60, for example, a method of coating a coating liquid containing a precursor of the insulating film on the wafer W may be adopted.

In the above-described embodiment, isocyanate is spin-coated on the wafer W. Alternatively, isocyanate mist may be supplied in a state in which the wafer W is stopped.

In the above-described embodiment, the polyurea film is produced by the self-polymerization of isocyanate. Alternatively, as shown in an example in FIG. 12, the polyurea film may be produced by copolymerization using isocyanate and amine. R is, for example, an alkyl group (linear alkyl group or cyclic alkyl group) or an aryl group, and n is an integer of two or more.

In this case, it may be possible to adopt, for example, a method in which the liquid of one of isocyanate and amine is supplied to the wafer by a spin coating method as described above to allow the liquid to permeate into the low dielectric constant film, and then the liquid of the other of isocyanate and amine is similarly supplied to the wafer by a spin coating method to allow the liquid to penetrate into the low dielectric constant film. Alternatively, the isocyanate and the amine may be, for example, alternately supplied multiple times so that they are sequentially supplied to the wafer in the form of a gas (vapor). In this case, for example, the vapor of isocyanate diffuses into and adsorbs to the pores of the low dielectric constant film, and then the vapor of the amine diffuses into the pores to generate a polymerization reaction. Such an action is repeated so that the pores are filled with a polyurea film.

Since the polyurea itself is a solid and cannot be converted into a liquid, the method is adopted in which raw materials to become polyurea are separately supplied to the film as described above to produce polyurea in the film.

In the method using the vapors of raw material monomers, the vapor pressures of the raw material monomers may be far apart from each other, for example, different from each other by one digit or more. The reason for this is that in a combination of vapor pressures close to each other, for example, when diffusing amine into the pores of the low dielectric constant film, the amine is adsorbed onto surfaces of the pores, as a result of which the reaction efficiency of the amine with the isocyanate deteriorates.

Examples of combinations in which the difference in vapor pressure between isocyanate and amine is one digit or more may include an example in which a skeleton molecule obtained by removing an isocyanate functional group from isocyanate and a skeleton molecule obtained by removing an amine functional group from amine are the same, namely an example in which isocyanate and amine are provided with the same skeleton molecule. For example, the vapor pressure of H6XDA to which an amine functional group is bonded is higher by one digit or more than the vapor pressure of H6XDI which is the same skeleton molecule as the skeleton molecule of H6XDA and to which an isocyanate functional group is bonded.

Figure 14A:
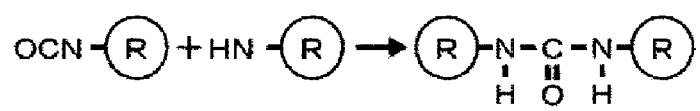
FIGS. 14A and 14B are explanatory views showing how a polymer having a urea bond is produced using a secondary amine.
Figure 14B:
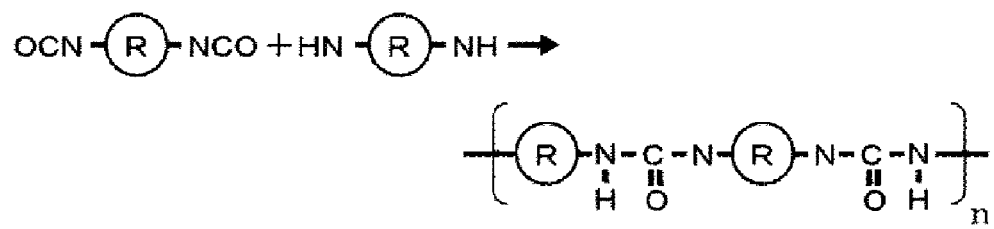

As shown in FIGS. 13A to 13D, mono-functional molecules may be used as the raw material monomers. Furthermore, as shown in FIGS. 14A and 14B, isocyanate and secondary amine may be used. The bond contained in a polymer produced in this case is a urea bond.

A raw material monomer having a urea bond may be polymerized to obtain a polyurea film. In this case, the raw material monomer may be supplied to the low dielectric constant film in the state of liquid, mist or vapor. FIG. 15 shows such an example, in which polymerization is generated to form a polyurea film by irradiating a raw material monomer with light, for example, ultraviolet rays, and giving light energy to the raw material monomer. If the polyurea film is heated at, for example, 350 degrees C., the polyurea film is depolymerized into isocyanate and amine.

Figure 16:
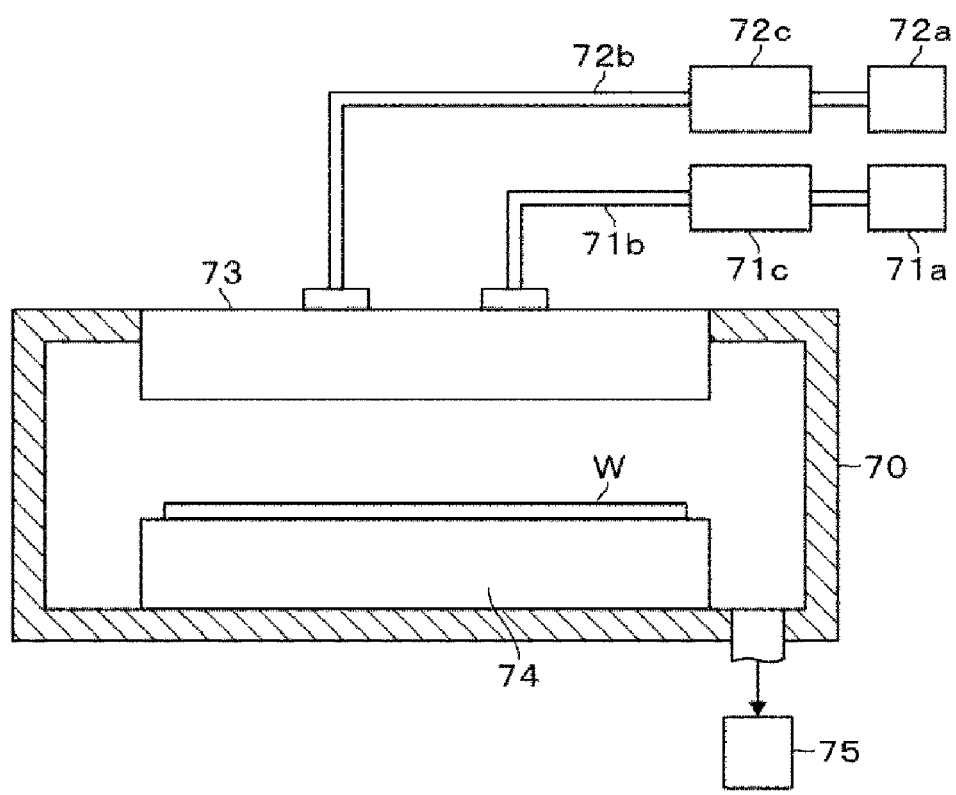
FIG. 16 is a sectional view showing an apparatus for producing a polymer having a urea bond by reacting isocyanate and amine with water vapor.

FIG. 16 shows a CVD apparatus for reacting a raw material monomer with a gas to produce (vapor-deposition polymerize) polyurea inside the low dielectric constant film 20. Reference numeral 70 denotes a vacuum container which defines a vacuum atmosphere. Reference numerals 71$a$ and 72$a$ denotes raw material supply sources for accommodating isocyanate and amine as raw material monomers in a liquid state, respectively. The isocyanate liquid and the amine liquid are vaporized by vaporizers 71$c$ and 72$c$ installed in supply pipes 71$b$ and 72$b$, respectively. The respective vapors are introduced into a shower head 73 which is a gas discharge part. The shower head 73 has a number of discharge holes formed on the lower surface thereof and is configured to discharge isocyanate vapor and amine vapor from the separate discharge holes to the processing atmosphere. A wafer W is mounted on a mounting table 74 equipped with a temperature adjustment mechanism. First, the isocyanate vapor is supplied to the wafer W, whereby the isocyanate vapor enters a low dielectric constant film formed on the wafer W. Subsequently, the supply of isocyanate vapor is stopped, and the interior of the vacuum container 70 is evacuated. Thereafter, the amine vapor is supplied to the wafer W. The isocyanate remaining in the low dielectric constant film reacts with the amine to produce polyurea.

Second Embodiment

A second embodiment of the present disclosure will be described. This embodiment is an embodiment in which the present disclosure is applied to a process of forming a RAM, and is an example in which damage caused by over-etching of electrodes is prevented by a protective layer made of polyurea.

FIGS. 17A to 17D shows a state in which a memory element film 83 for forming a memory element is formed on an electrode 82 of a lower-layer-side circuit surrounded by an insulating film 81, an electrode film 84 is formed on the memory element film 83, and a protective layer (polyurea film) 85 made of polyurea is formed on the electrode film 84. In this example, the electrode film 84 corresponds to a protected film to be protected. Examples of the memory element may include a ReRAM, a PcRAM, an MRAM and the like. Examples of the memory element film 83 may include a metal oxide film used for a ReRAM (resistance change type memory).

The electrode film 84 is formed of, for example, a laminated film in which a titanium nitride (TiN) film and a tungsten (W) film are laminated in the named order from below.

Figure 12:
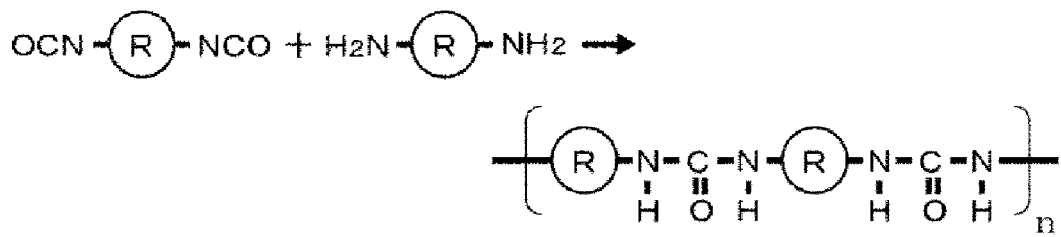
FIG. 12 is an explanatory view showing how a polymer having a urea bond is produced by a copolymerization reaction.
Figure 13A:
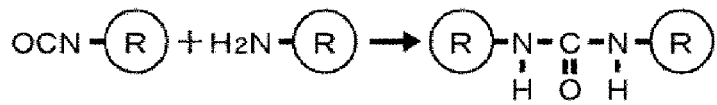
FIGS. 13A to 13D are explanatory views showing a reaction in which a polymer having a urea bond becomes an oligomer.
Figure 13B:
Figure 13C:
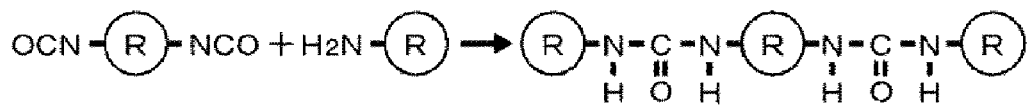
Figure 13D:
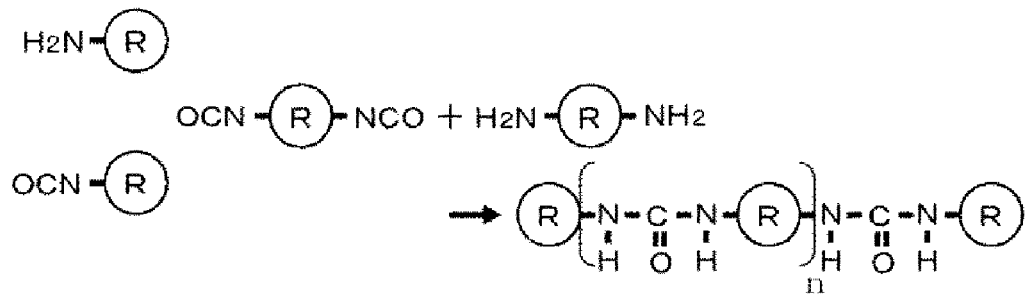

The protective layer (polyurea film) 85 made of polyurea is produced by, for example, copolymerization using isocyanate and amine as shown in FIG. 12 described above. A thickness of the protective layer 85 is set to, for example, 20 nm to 50 nm. In this case, as an apparatus for producing the protective layer, the above-mentioned CVD apparatus shown in FIG. 16 may be used.

Figures 18E, 18F:
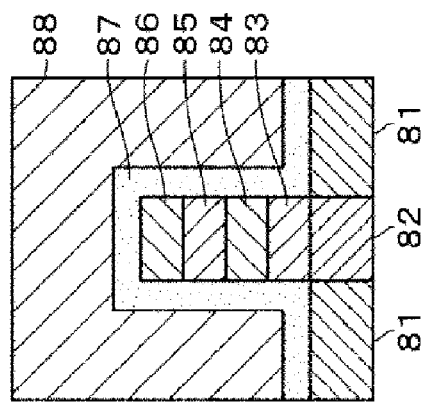
FIGS. 18E to 18H are explanatory views showing some steps of the semiconductor device manufacturing method according to the second embodiment of the present disclosure.

Subsequently, a mask film (hard mask) 86 is formed on the protective layer 85 (FIG. 18E). Examples of the mask film 86 may include a boron (B)-containing silicon film. The boron (B)-containing silicon film is formed using, for example, a silane-based gas and a $B_2H_6$ gas which is a doping gas. Thereafter, a resist pattern is formed on the mask film 86 to form a pattern on the mask film 86. Using the mask film 86 as a hard mask, the protective layer 85, the electrode film 84 and the memory element film 83 are etched to transfer the pattern thereto (FIG. 18F).

Figure 18G:
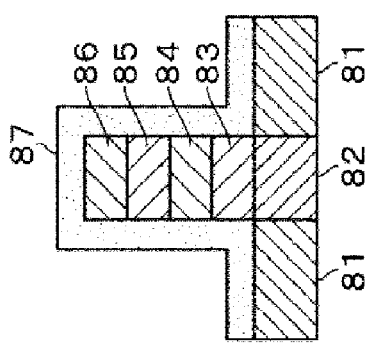

Subsequently, a sealing film 87 made of, for example, a polyimide film, is formed so as to cover an upper surface and a side surface of a laminate including the mask film 86, the memory element film 83, the electrode film 84 and the protective layer 85 (FIG. 18G). As described in the first embodiment, the sealing film 87 is used for suppressing depolymerization when heated at a temperature higher than the temperature at which the protective layer 85 is depolymerized.

Figure 18H:
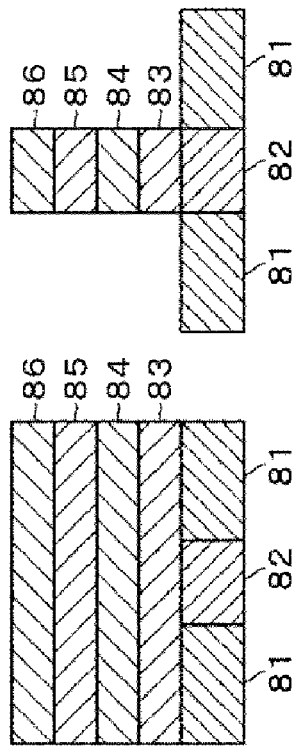

Furthermore, an insulating film, for example, a silicon oxide film 88 is formed as an element separation film for electrically separating elements from each other, around the laminate including the memory element film 83, the electrode film 84 and the protective layer 85, thereby creating a state in which the laminate is buried in the silicon oxide film 88 (FIG. 18H). The silicon oxide film 88 is formed, for example, by CVD at a process temperature of 300 degrees C. in a vacuum atmosphere. The process of forming the silicon oxide film 88 corresponds to a process performed on the wafer W at a temperature higher than the temperature at which the protective layer is depolymerized.

Subsequently, a portion corresponding to the laminate in the silicon oxide film 88 is etched with an etching gas to reach the protective layer 85, thereby forming a contact hole 89 (FIG. 19I). Thereafter, the protective layer 85 is heated to depolymerize polyurea, thereby removing the protective layer 85 (FIG. 19J). As the step of depolymerizing polyurea, the same method as described in the first embodiment may be adopted. Then, a metal serving as a conductive path, for example, copper, is embedded in the contact hole 89. Excess metal is removed by CMP to form a conductive path 91, thereby manufacturing a memory element (FIG. 19K).

According to the above-described embodiment, the following effects may be obtained. In the absence of the protective layer 85, when the contact hole 89 is opened by dry etching, the surface of the electrode film 84 is oxidized by the over-etching of the mask film 86, whereby a damaged layer is formed. Therefore, the damaged layer is interposed at an interface between the electrode film 84 and the conductive path 91, which may adversely affect the electric characteristics. In contrast, in the above-described embodiment, the protective layer 85 is formed on the surface of the electrode film 84 and may be removed by heat. It is therefore possible to prevent a damaged layer from being formed on the surface of the electrode film 84.

After the protective layer 85 is formed, the insulating film 88 is formed at a temperature equal to or higher than the depolymerization temperature of the polyurea. Since the protective layer 85 is covered with the sealing film 87, the depolymerization of polyurea is suppressed so that the function of the protective layer 85 is not impaired.

Figure 20:
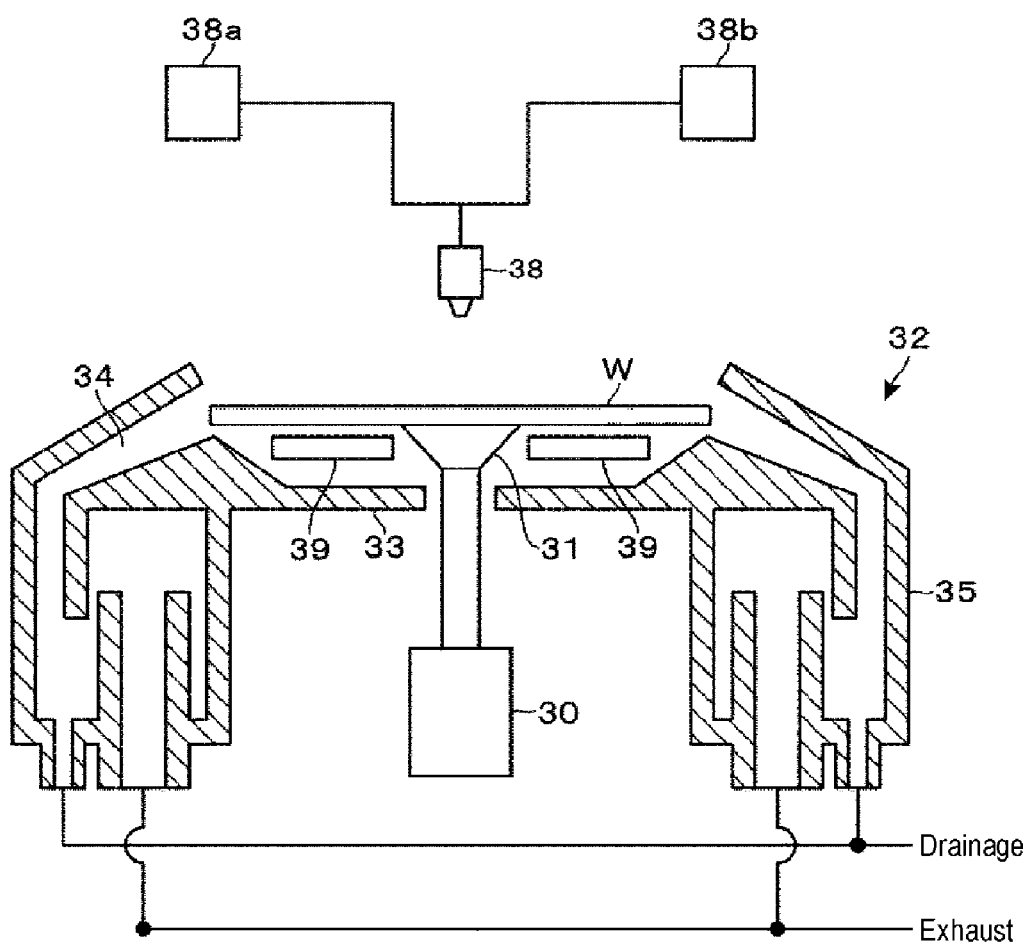
FIG. 20 is a sectional view showing an apparatus for supplying isocyanate liquid and amine liquid to a substrate.

The method of producing the protective layer 85 is not limited to CVD, but may be the liquid processing described with reference to FIG. 9 in the first embodiment. Alternatively, the method of producing the protective layer 85 may be a method performed using a coating apparatus shown in FIG. 20. In FIG. 20, portions corresponding to the reference numerals shown in FIG. 9 are denoted by the same reference numerals. Reference numeral 38*a* denotes a supply source of a chemical solution, for example, H6XDI, and reference numeral 38*b* is a supply source of a chemical solution, for example, 1,3-bis (aminomethyl) cyclohexane (H6XDA). The coating apparatus is configured so that these chemical solutions are joined immediately before the nozzle 38 and a mixed liquid thereof is supplied to the central portion of the wafer W. As the wafer W rotates, the mixed liquid spreads on the wafer W, whereby the protective layer 85 which is a polyurea film is formed. In addition, as shown in FIG. 20, a heating part 39 composed of, for example, a light emitting diode, is disposed below the wafer W. The wafer W is heated by the heating part 39 to promote polymerization.

The raw material used for forming the protective layer 85 is not limited to the above-mentioned example, but may be, for example, the above-mentioned raw materials shown in FIGS. 13A to 15.

Example

[Evaluation Test 1]

Figure 21:
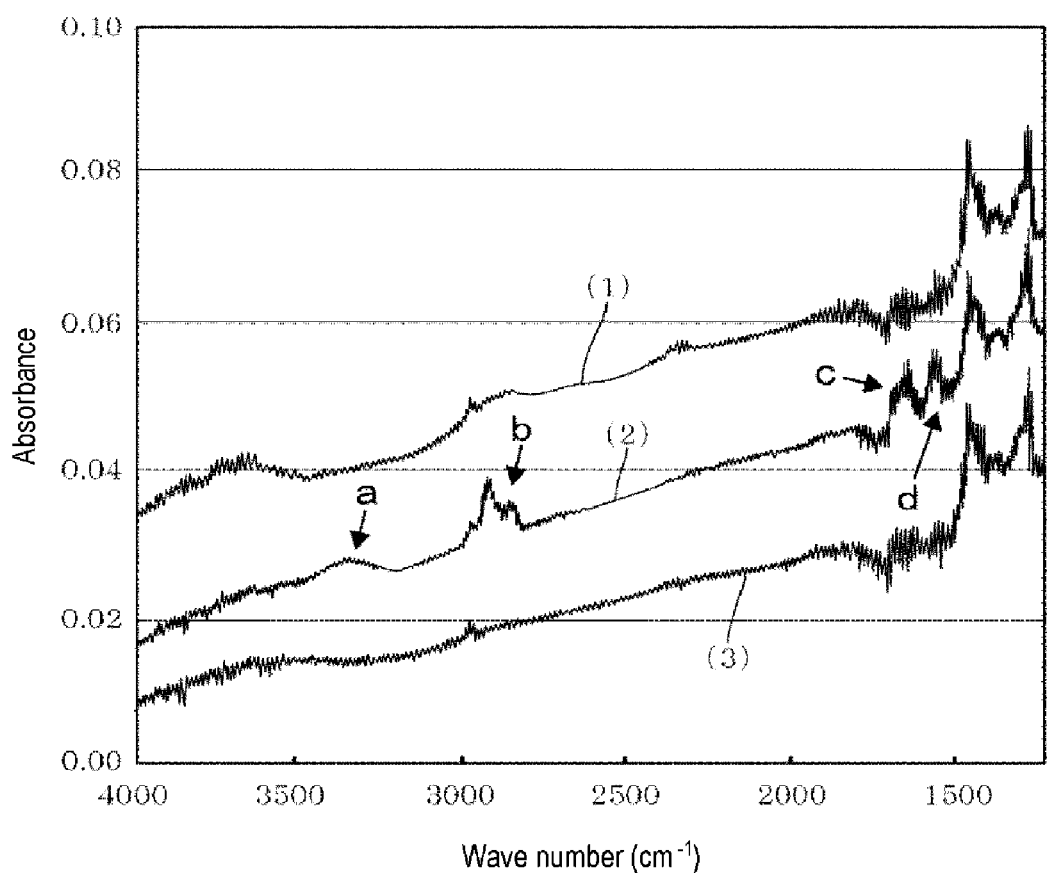
FIG. 21 is a characteristic diagram showing absorption spectra before and after embedment of polyurea in a low dielectric constant film.

A low dielectric constant film made of a SiOC film was formed on a bare wafer. Absorption spectra were measured for each of a low dielectric constant film before filling of polyurea, a low dielectric constant film after filling of polyurea and a low dielectric constant film after removing of polyurea. The measurement results are as shown in FIG. 21. In FIG. 21, curves (1) to (3) correspond to before filling of polyurea, after filling of polyurea, and after removing of polyurea, respectively. In curve (2) obtained after filling of polyurea, peaks corresponding to an NH bond (indicated by arrow a), a CH bond (indicated by arrow b), a CO bond (indicated by arrow c) and a CN bond (indicated by arrow d) are illustrated. However, in curve (1) obtained before filling of polyurea and curve (3) obtained after removing of polyurea, these peaks are not seen.

From these results, it was confirmed that polyurea is filled into the pores of the low dielectric constant film by the method described in the first embodiment, and further that polyurea is not left in the low dielectric constant film by performing the polyurea removal process.

[Evaluation Test 2]

Figure 22:
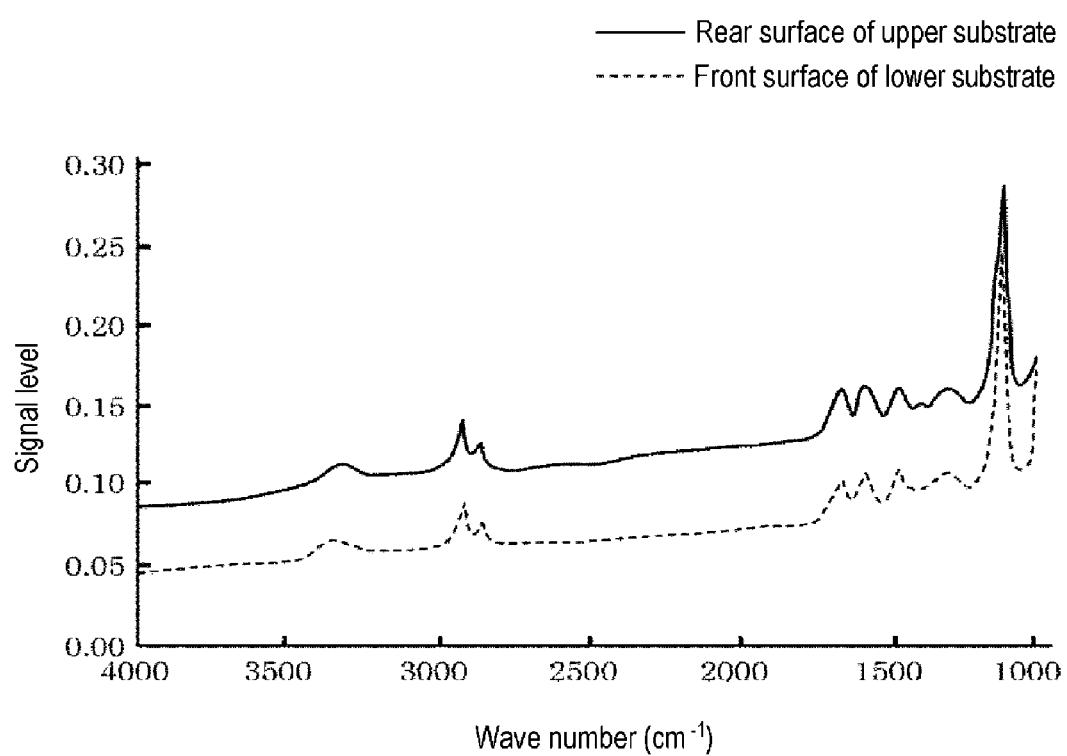
FIG. 22 is a characteristic diagram showing absorption spectra after overlapping and heating two substrates on which a polyurea film is formed.

Polyurea films were formed on surfaces of two substrates each having a square shape with a side length of 5 cm by the vacuum deposition described above. These substrates were stacked and heated in a nitrogen gas atmosphere at 350 degrees C. for 5 minutes. During this heat treatment, the absorption spectrum was measured by infrared absorption spectroscopy (IR) on a rear surface (lower surface) of the upper substrate and a front surface (upper surface) of the lower substrate, respectively. The measurement results are shown in FIG. 22. The spectrum of the rear surface of the upper substrate is indicated by a solid line waveform, and the spectrum of the front surface of the lower substrate is indicated by a dotted line waveform. Each of these spectra shows that a polyurea film is present at the measured location. In addition, when viewed visually, a polyurea film seems to be present on the rear surface of the upper substrate and on the front surface of the lower substrate. No polyurea film is seen on the front surface of the upper substrate and on the rear surface of the lower substrate.

From the state of the front surface of the upper substrate, it was confirmed that the polyurea film can be removed by heating the respective substrate. Since the polyurea film disappears on the front surface of the upper substrate in this manner, it is considered that the polyurea film formed between the upper substrate and the lower substrate is prevented from disappearing during the hearing because the polyurea film is sandwiched between the two substrates. The reason for this is that there is a presumption that depolymerization is suppressed because there is no escape place of a monomer produced by depolymerization. Accordingly, it was confirmed that, by forming the sealing film on the polyurea film (protective layer) as described above, the protective layer does not disappear even if the heating temperature is higher than the temperature at which depolymerization should occur.

[Evaluation Test 3]

Figure 23:
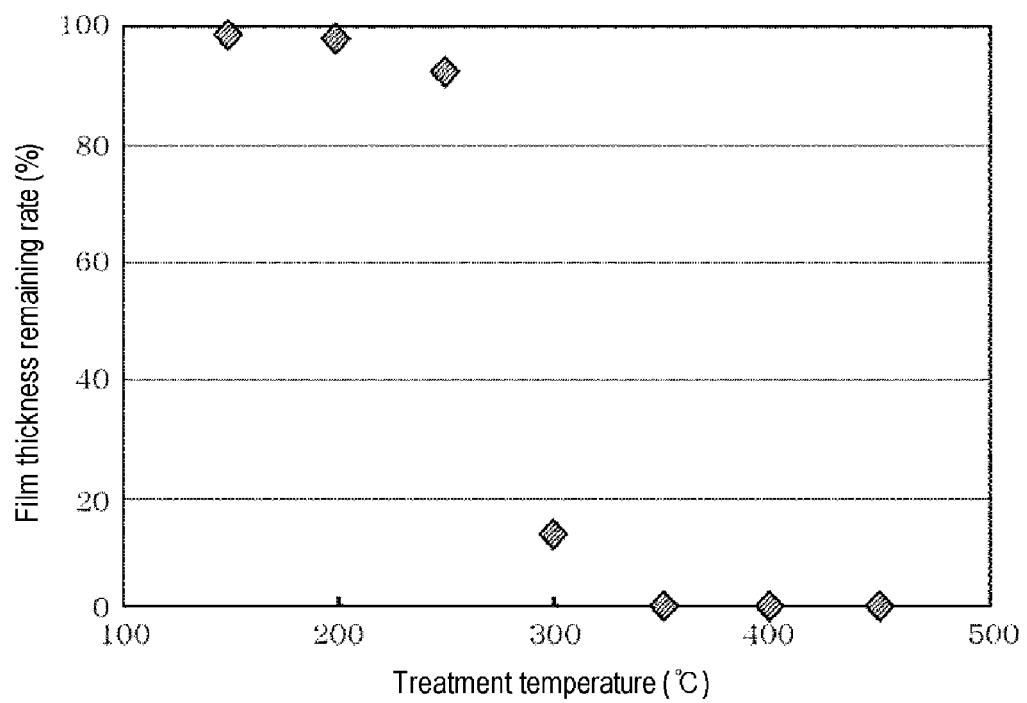
FIG. 23 is a characteristic diagram showing the relationship between a film thickness of a polyurea film and a heating temperature.

A polyurea film having a film thickness of 400 nm was formed on a square silicon substrate having a side length of 6 cm, and then the polyurea film was heated in a nitrogen gas atmosphere for 5 minutes. The heating temperature was set in increments of 50 degrees C. in a range from 150 degrees C. to 450 degrees C. The film thickness of the polyurea film after the heat treatment (annealing) was measured. The result shown in FIG. 23 was obtained. From this result, it can be seen that the polyurea film is not depolymerized at 250 degrees C., but depolymerization greatly proceeds at 300 degrees C. so that the polyurea film completely disappears at 350 degrees C.

[Evaluation Test 4]

Figure 24:
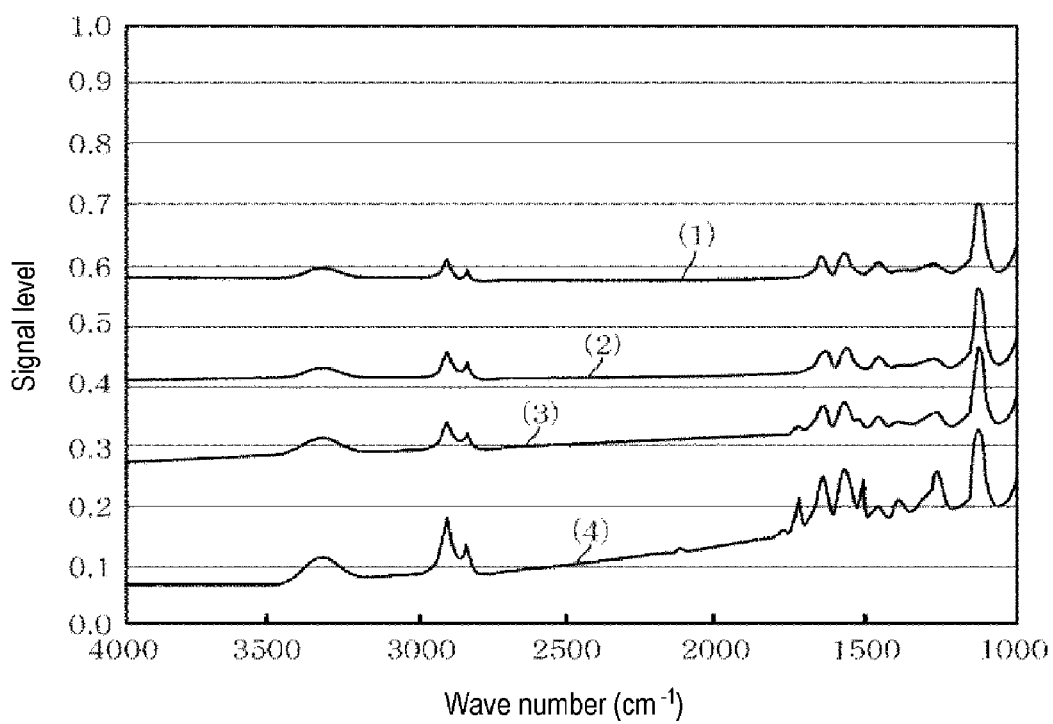
FIG. 24 is a characteristic diagram showing the measurement results of absorption spectra of a polyurea film after heating for each film thickness of a polyimide film formed on the polyurea film.

Four square silicon substrates having a side length of 6 cm were prepared, and a polyurea film having a film thickness of 400 nm was formed on each of the silicon substrates. Polyimide films having film thicknesses of 10 nm, 30 nm and 70 nm, respectively, were formed on the polyurea films of the three substrates. A polyimide film was not formed on the remaining one substrate. These four samples were thermally treated at 300 degrees C. for 5 minutes in a nitrogen gas atmosphere, and then absorption spectra were measured by infrared absorption spectroscopy (IR). The measurement results are shown in FIG. 24. In FIG. 24, curve (1) corresponds to a substrate on which no polyimide film is formed, curve (2) corresponds to a substrate on which a polyimide film is formed with a film thickness of 10 nm, curve (3) corresponds to a substrate on which a polyimide film is formed with a film thickness of 30 nm, and curve (4) corresponds to a substrate on which a polyimide film is formed with a film thickness of 70 nm. Since the position of the wave number of a CH bond or the like in the absorption spectra has already been explained in the section of evaluation test 1, the same explanation for FIG. 24 is omitted.

From these results, it can be seen that when the thickness of the polyimide film as a sealing film is 10 nm or 30 nm, the degree of depolymerization of the polyurea film is somewhat smaller than when the polyimide film is not formed, but depolymerization proceeds considerably. In contrast, it can be noted that when the thickness of the polyimide film is 70 nm, the depolymerization of the polyurea film does not occur.

[Evaluation Test 5]

Four kinds of samples similar to the samples used in evaluation test 4 were prepared. That is to say, a sample in which a sealing film is not formed on a polyurea film and three kinds of samples in which polyimide films having film thicknesses of 10 nm, 30 nm and 70 nm are formed on respective polyurea films were prepared. With respect to the respective samples, the heating temperatures were set at four levels of 250 degrees C., 275 degrees C., 300 degrees C. and 325 degrees C., and heat treatments were performed at the respective heating temperatures for 5 minutes.

Figure 25:
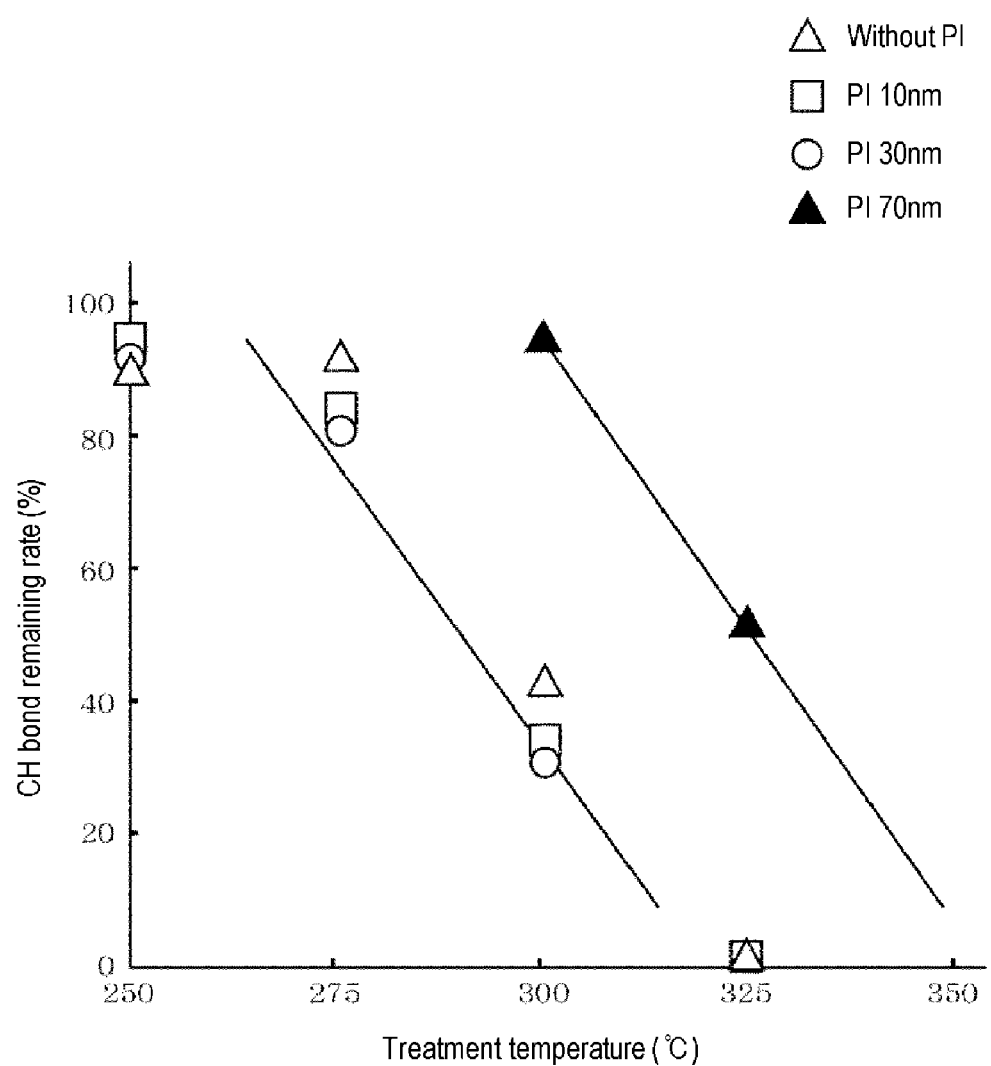
FIG. 25 is a characteristic diagram showing the relationship between a residual ratio of CH bonds of a polyurea film after heating and a heating temperature for each film thickness of a polyimide film formed on the polyurea film.

For these samples, absorption spectra were measured by infrared absorption spectroscopy, and the peak value of a CH bond corresponding to the skeleton of the polyurea film was obtained. Then, a ratio of the peak value after the heat treatment to the peak value before the heat treatment was obtained. The ratio of the peak value was plotted for each heat treatment temperature to obtain a graph of FIG. 25. In FIG. 25, PI is an abbreviation for the polyimide film. For the sake of convenience, the ratio of the peak value will be referred to as bond remaining rate.

Figure 26:
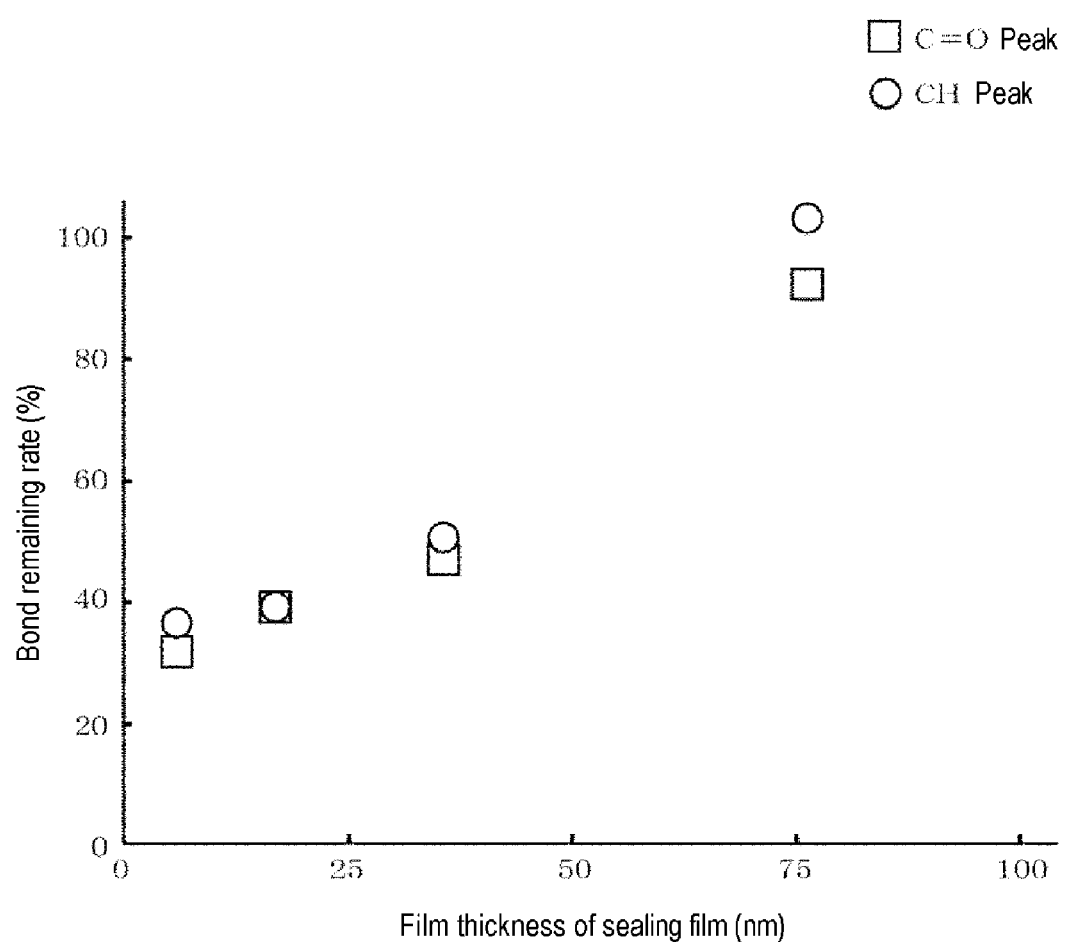
FIG. 26 is a characteristic diagram showing the relationship between a film thickness of a polyimide film formed on a polyurea film and a residual ratio of CH bonds and NH bonds of the polyurea film after heating.

For the sample having a heating temperature of 300 degrees C., the peak value of a C=O bond corresponding to a urea bond was also obtained. Then, for each of the CH bond peak value and the C=O bond peak value, a ratio of the peak value after the heat treatment to the peak value before the heat treatment was obtained. A relationship between the thickness of the polyimide film and the ratio of the peak values was obtained. The results are as shown in FIG. 26.

From these results, it is understood that when the polyimide film is formed on the polyurea film, if the polyimide film is 70 nm in the above example, depolymerization does not occur even when heated to 300 degrees C. Therefore, it is understood that the polyimide film is effective as a sealing film capable of suppressing depolymerization with respect to the polyurea film.

[Evaluation Test 6]

A relationship between the film thickness and the heat resistance was investigated for the polyurea film on which the polyimide film is not laminated. Polyurea films were formed on silicon substrates with film thicknesses of 280 nm, 360 nm and 3,000 nm, respectively. For the respective samples, heat treatments were performed for 5 minutes while changing the heating temperature. With respect to the films formed on the respective substrates before and after the heat treatments, absorption spectra were measured by infrared absorption spectroscopy.

Figure 27:
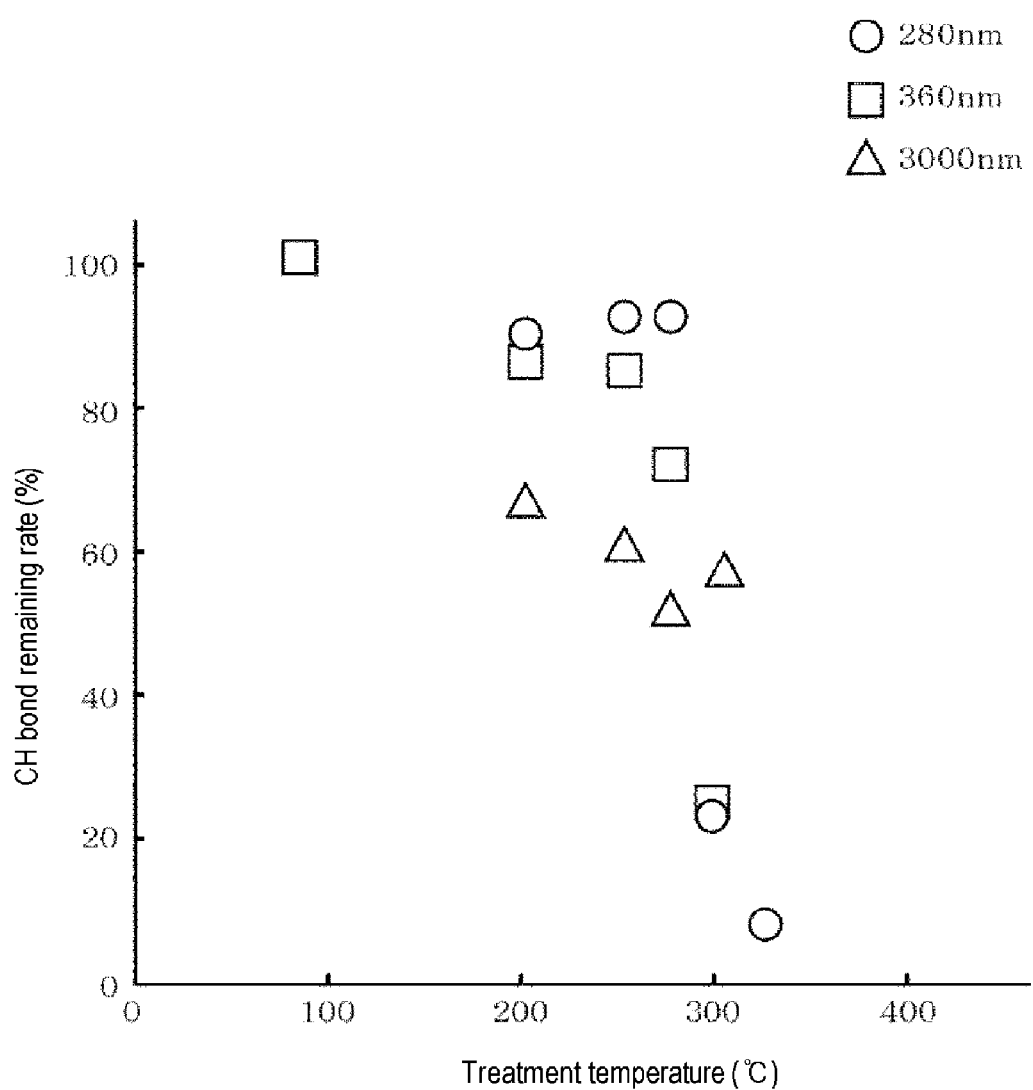
FIG. 27 is a characteristic diagram showing the relationship between a film thickness after heating and a residual ratio of CH bonds for a single polyurea film.
Figure 28:
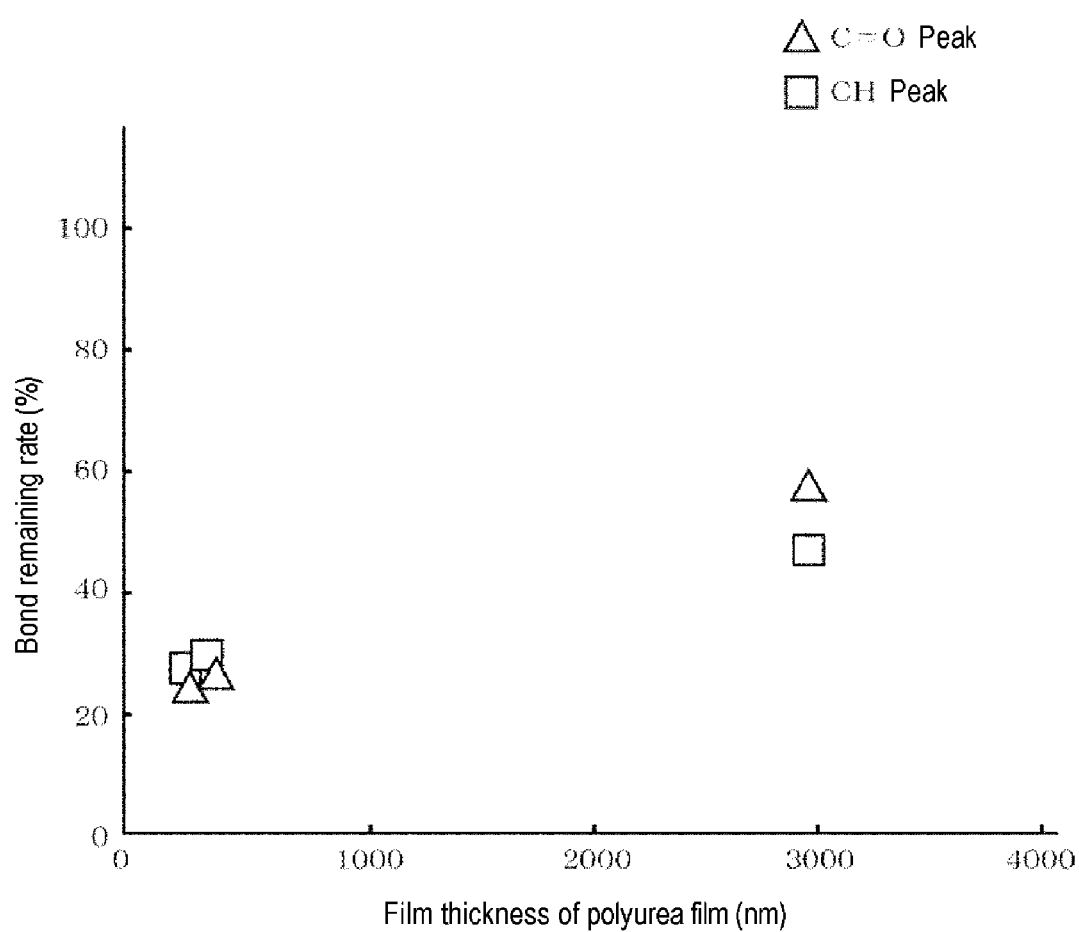
FIG. 28 is a characteristic diagram showing the relationship between a film thickness and a residual ratio of CH bonds and NH bonds of a polyurea film after heating for the single polyurea film.

For the CH bond, a ratio of the peak value after the heat treatment to the peak value before the heat treatment (CH bond remaining rate) in each sample was obtained. A relationship between a CH bond remaining rate and the heating temperature was obtained for each thickness of polyurea. The results are shown in FIG. 27. In addition, when the heating temperature is 300 degrees C., the film thickness of the polyurea film and the respective remaining rates of the CH bond and the C=O bond were obtained. The results are shown in FIG. 28.

From these results, it was found that even if the film thickness of the polyurea film is increased, the improvement of heat resistance cannot be expected.

According to the present disclosure, a protective layer composed of a polymer having a urea bond is formed on a surface of a substrate on which a protected film to be protected is formed. The protective layer is sealed with a sealing film, thereby improving the heat resistance of the protective layer. Thereafter, a process of applying damage to the protected film is performed (in the absence of a protective layer). Then, the substrate is heated to depolymerize the polymer. Thus, even if a process that may apply damage to the protected film is performed, it is possible to suppress damage to the protected film, because the protective layer is present.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device by performing a process on a substrate, comprising:

forming a protective layer made of a polymer having a urea bond by supplying a raw material for polymerization to a surface of a substrate on which a protected film to be protected is formed;

forming a sealing film at a first temperature lower than a second temperature at which the polymer is depolymerized, so as to cover a portion where the protective layer is exposed;

after the forming a sealing film, subjecting the substrate to a treatment at a third temperature equal to or higher than the second temperature at which the polymer as the protective layer is depolymerized;

after the subjecting the substrate to a treatment at a third temperature, performing a treatment which causes damage to the protected film when the protective layer is not present; and after the performing a treatment which causes damage to the protected film, depolymerizing the polymer by heating the substrate, wherein the forming a protective layer includes supplying isocyanate and amine to the protected film, and heating the substrate to polymerize the isocyanate and the amine.

2. The method of claim 1, wherein the protected film is a porous low dielectric constant film, the protective layer including a polymer embedded in pores of the low dielectric constant film, wherein the subjecting the substrate to a treatment at a third temperature equal to or higher than the second temperature at which the polymer is depolymerized includes forming a thin film on the sealing film, and wherein the performing a treatment which causes damage to the protected film is a plasma process for forming a recess in the low dielectric constant film.

3. The method of claim 2, wherein the supplying isocyanate and amine to the protected film is performed by sequentially diffusing one and the other of a vapor of isocyanate and a vapor of amine into the low dielectric constant film and heating the substrate to polymerize the isocyanate and the amine.

4. The method of claim 2, wherein the supplying isocyanate and amine to the protected film includes impregnating a liquid or mist of isocyanate and moisture to the protected film to hydrolyze the isocyanate to produce the amine.

5. The method of claim 4, wherein the moisture is impregnated into the protected film by bringing an atmosphere in which the substrate is placed into a water vapor atmosphere after the liquid or mist of isocyanate is impregnated into the protected film.

6. The method of claim 1, wherein the protected film is an electrode film made of a metal or a metal compound, the method further comprising: etching the protective layer and the electrode film by forming a pattern mask film on the protective layer formed on the electrode film, wherein the forming a sealing film includes, after the etching, covering the entirety of a laminate composed of the pattern mask film, the protective layer and the electrode film with the sealing film which is a first insulating film, wherein the subjecting the substrate to a treatment at a third temperature equal to or higher than the second temperature at which the polymer is depolymerized includes forming a second insulating film from above the sealing film, and wherein the performing a treatment which causes damage to the protected film includes forming a contact hole reaching the protective layer by etching the second insulating film formed on the sealing film, and the sealing film.

7. The method of claim 6, wherein a memory element film is formed below the electrode film, and wherein the memory element film is etched in the etching the electrode film.

8. The method of claim 6, wherein the supplying isocyanate and amine to the protected film includes supplying a vapor of isocyanate and a vapor of amine to the substrate.

9. The method of claim 6, wherein the supplying isocyanate and amine to the protected film includes supplying a liquid of isocyanate and a liquid of amine to the substrate.

* * * * *